United States Patent [19]

Tanaka et al.

[11] Patent Number: 5,772,842
[45] Date of Patent: Jun. 30, 1998

[54] APPARATUS FOR STRIPPING PELLICLE

[75] Inventors: Shinichiro Tanaka, Itami; Sigeru Wada; Haruhiko Kusunose, both of Tokyo, all of Japan

[73] Assignees: Mitsubishi Denki Kabushiki Kaisha, Tokyo; Ryoden Semiconductor System Engineering Corporation, Hyogo, both of Japan

[21] Appl. No.: 561,065

[22] Filed: Nov. 22, 1995

[30] Foreign Application Priority Data

Nov. 28, 1994 [JP] Japan ................................. 6-293017

[51] Int. Cl.$^6$ ................................................. B32B 35/00
[52] U.S. Cl. ................... 156/584; 29/402.03; 29/426.2; 29/426.4
[58] Field of Search .................................. 156/344, 584; 29/402.03, 426.1, 426.2, 426.4, 564.1

[56] References Cited

U.S. PATENT DOCUMENTS

| 3,873,080 | 3/1975 | Bostic ................................. 156/584 X |
| 3,990,907 | 11/1976 | Endo et al. ................................. 134/2 |
| 4,255,216 | 3/1981 | Conant et al. ....................... 156/344 X |
| 4,317,986 | 3/1982 | Sullivan .............................. 156/344 X |
| 4,898,058 | 2/1990 | Seifert ................................. 156/584 X |
| 4,904,329 | 2/1990 | Hein et al. .............................. 156/344 |

FOREIGN PATENT DOCUMENTS

| 60-210687 | 10/1985 | Japan ..................................... 156/344 |
| 6-175356 | 6/1994 | Japan ..................................... 156/344 |

*Primary Examiner*—Mark A. Osele
*Attorney, Agent, or Firm*—Leydig, Voit & Mayer, Ltd.

[57] ABSTRACT

A pellicle stripping apparatus includes a supporting section for supporting a photomask, the supporting section having gripping portions for gripping at least two edges of a pellicle frame of a pellicle adhered to the photomask; and a steam generating section for generating high temperature steam and contacting the pellicle adhered to the photomask with the steam, the steam generating section including a container having a steam vent directly opposite a portion of the pellicle adhered to the photomask and a heater for boiling water in the container.

5 Claims, 7 Drawing Sheets

APPARATUS FOR STRIPPING PELLICLE

BACKGROUND OF THE INVENTION

1. Field of the Invention

The present invention relates to a pellicle stripping method and to an apparatus for stripping a pellicle from a glass photomask and the like used in, for example, the manufacturing process of semiconductor devices.

2. Description of the Related Art

FIG. 8 is a schematic representation illustrating a conventional process for photoengraving semiconductor devices. In this figure, a wafer 3 is placed opposite a glass photomask 1 provided with a pattern by a shield film (not shown in the figure) in an optical system 2. If a foreign object 4 attaches to the pattern forming face of the glass photomask 1, the image of the foreign object 4 is formed on the wafer 3.

Thus, as shown in FIG. 9, a pellicle 5 is provided to protect the pattern from foreign objects 4. The pellicle 5 has, for example, an aluminum pellicle frame 6 and a transparent pellicle membrane 7 made from nitrocellulose, and the pellicle frame 6 is adhered to the glass photomask 1 with an adhesive (not shown in the figure). The pattern forming face of the glass photomask 1 sits at a prescribed distance from the pellicle membrane 7, so the image of any foreign object 4 attached to the pellicle membrane 7 is not formed on the wafer 3 as it is defocussed.

However, severe contamination of the pellicle membrane 7 causes reduced light transmittance through the pellicle membrane 7 to the extent that normal photoengraving cannot be achieved, thereby necessitating the exchange of the pellicle 5. Furthermore, when large foreign objects stick to the pellicle 5 or when the pellicle membrane 7 is damaged it is also necessary to exchange the pellicle 5.

FIG. 10 is a cross-sectional view illustrating an example of a conventional pellicle stripping method, where a pellicle 5 is adhered to each face of a glass photomask 1. As shown in the figure, a tool 8 having a bent tip is used for stripping the no longer usable pellicle 5 from the glass photomask 1. The tool 8 physically strips the pellicle 5 by means of leverage.

FIG. 11 is a cross-sectional view illustrating another example of a conventional pellicle stripping method, where the container 9 is filled with an organic solvent 10, and the pellicle 5 and glass photomask 1 are immersed therein. The glass photomask 1 is secured by a retainer 11.

In this method, after the organic solvent 10 penetrates into the adhesive between the pellicle 5 and the glass photomask 1 the adhesive strength is decreased and the pellicle can be stripped from the photomask 1.

Among such conventional pellicle stripping methods, the method using the tool 8 has the drawbacks that some damage is done to the part of the glass photomask 1 that the tool 8 contacts and the metal powder of the shield film attaches to the pattern. Furthermore, use of an organic solvent 10 has the drawbacks that periodic medical examinations of workers are needed due to the slight possibility of their inhaling the organic solvent 10, and, also that unwanted adhesive adheres to the photomask 1 due to the wetting of the glass photomask 1 by the solvent 10 containing the dissolved adhesive.

SUMMARY OF THE INVENTION

An foregoing problems have been solved by the methods and apparatus of the present invention. The object of the present invention is to provide a pellicle stripping method and a pellicle stripping apparatus which easily strips the pellicle without damage to the photomask, harmful affects to the human body, or unwanted adhesion of the adhesive to the photomask.

According to this invention, a pellicle stripping method comprises the steps of, immersing a section of a pellicle adhered to a photomask into warm water (50° C. to 100° C.), to decrease the adhesiveness of the adhesive at the adhered section, and stripping the pellicle from the photomask.

A pellicle stripping method comprises the steps of, exposing a section of a pellicle adhered to a photomask into high temperature steam, to decrease the adhesiveness of the adhesive at the adhered section, and stripping the pellicle from the photomask.

Also according to this invention, a pellicle stripping apparatus comprises: a supporting section for supporting a photomask, the supporting section having gripping portions gripping the surface of both sides of a pellicle frame of a pellicle adhered to the photomask; and a steam generating section generating a high temperature steam and contacting the steam with the adhesion section of the pellicle adhered to the photomask.

BRIEF DESCRIPTION OF THE DRAWINGS

For a full understanding of the invention, the following detailed description should be read in conjunction with the drawings, wherein.

DETAILED DESCRIPTION OF THE PREFERRED EMBODIMENTS

Embodiments of the present invention will be described below with reference to the drawings.

First Embodiment

Figure 1:
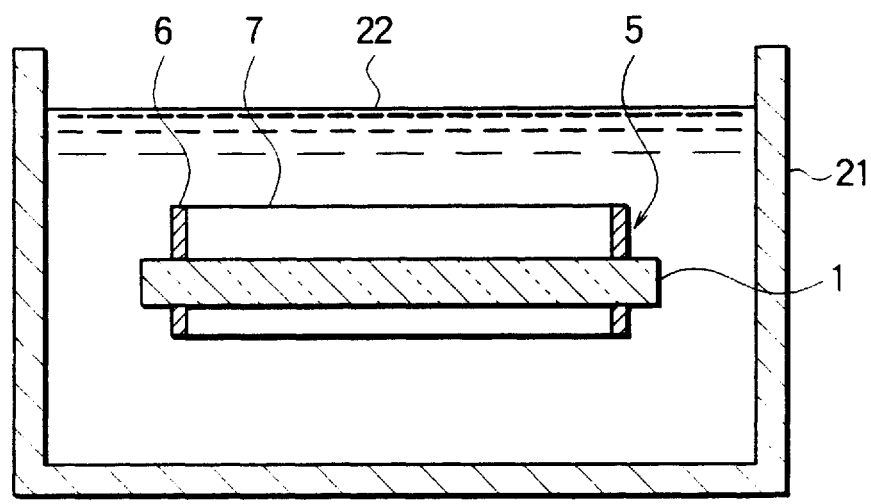
FIG. 1 is a cross-sectional view illustrating a pellicle stripping method of a first embodiment of the present invention.

FIG. 1 is a cross-sectional view illustrating a pellicle stripping method based on a first embodiment of the present invention. Identical or equivalent parts to those shown in FIGS. 8–11 are assigned the same reference numerals and the description thereof will be omitted.

In this figure, a container 21 is filled with warm water 22 obtained by heating pure water at a temperature of from 50° C. to 100° C.. A glass photomask 1 with a pellicle 5 adhered thereto is immersed in the warm water 22. In the first embodiment, after the pellicle 5 and the glass photomask 1 are immersed in the warm water 22 for the prescribed time, these are removed, and the pellicle 5 is then stripped.

According to this method, as the warm water penetrates the circumference of the adhesive and the adhesiveness of the adhesive decreases, the pellicle 5 is easily stripped manually without any excessive force by a special tool or the like, so the glass photomask is not damaged. Furthermore, the use of the warm water 22 does not affect humans, and the glass photomask 1 is protected from contamination by unwanted adhesive on stripping the pellicle 5, because the adhesive can be completely stripped from the glass photomask 1 while the adhesive remains adhered to the pellicle 5.

Although taking the glass photomask 1 in and out of the warm water 22 and stripping the pellicle 5 can be manually carried out, when the water temperature is high, a tool, for example, a gripping tool may be used in such a manner that no damage is done to the glass photomask 1.

Figure 2:
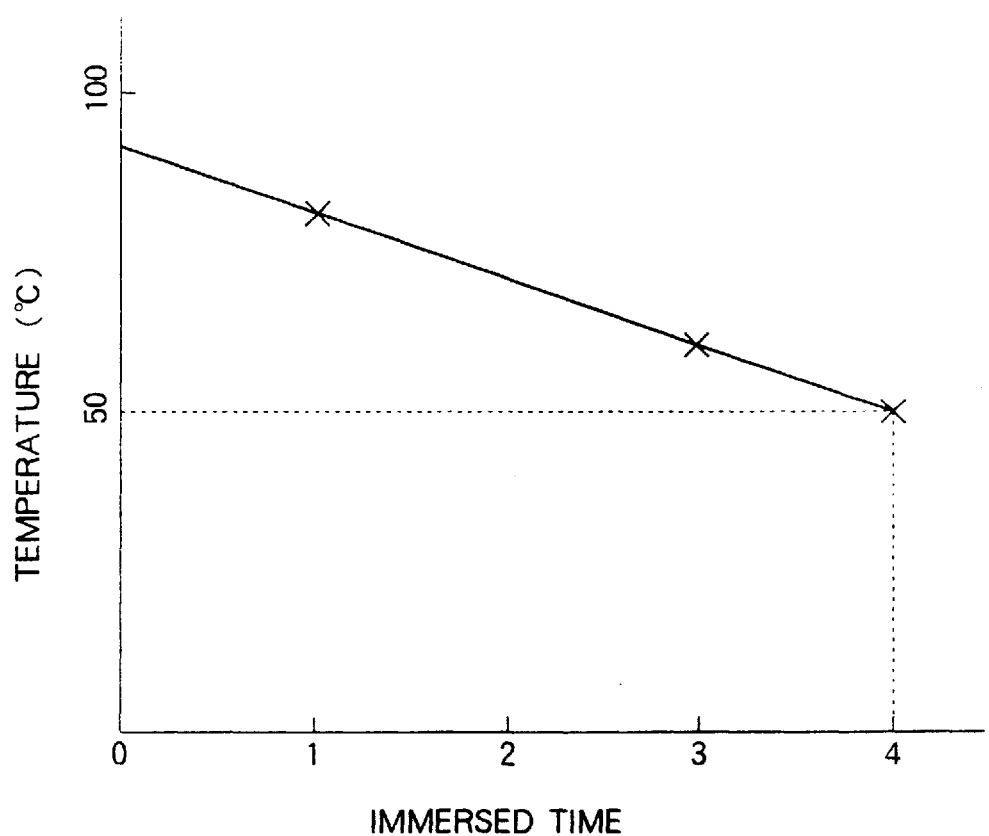
FIG. 2 is a graph showing the correlation between water temperature and immersed time based on the results of experiments of the pellicle stripping time dependence on temperature.

FIG. 2 shows the correlation between the water temperature and the immersion time illustrating the results of the experiments of the pellicle stripping time dependence on the temperature, where the immersion time represents the time necessary for the photomask to be immersed in the warm water so that the pellicle can be easily stripped manually. The figure shows that the higher the water temperature the less immersion time is necessary for peeling. At a temperature less than 50° C., the adhesiveness of the adhesive does not sufficiently decrease, and it is difficult to strip even after a long immersion time. Therefore, the results show that the suitable water temperature is in the range of from 50° C. to 100° C.. Furthermore, with respect to working efficiency, as it is desirable to keep the immersion time to about one minute, a preferable water temperature is around 80° C., particularly 70° C. to 100° C..

Although an acrylic adhesive having an adhesion strength of 1,207 g/inch was used in the above experiments, the characteristics shown in FIG. 2 will vary to some extent depending on the adhesive strength.

Second Embodiment

Next, the second embodiment of the present invention will be described. In the first embodiment, whereas after the pellicle 5 and the glass photomask 1 are immersed in the warm water 22, they are remove to strip the pellicle 5, in this second embodiment, the pellicle 5 is stripped in the warm water 22.

As mentioned above, when the pellicle 5 and the glass photomask 1 are immersed in the warm water 22, it is possible that the contaminants which had adhered to the pellicle and the like may adhere to the glass photomask 1 after dissolving into the warm water. Contaminants adhered to the glass photomask 1 are hard to remove after drying. However, when carrying out the stripping step in warm water 22, such as in the second embodiment, and then proceeding to the next cleaning step while the photomask is still wet and at a high temperature, the contaminants can be removed comparatively easily.

Third Embodiment

The third embodiment of the present invention will be described. In this third embodiment, a surfactant is added to the warm water 22 of the first and second embodiments. A surfactant containing polyvinylphenylether as a major component, for example can be used.

The use of a surfactant makes the stripping of the pellicle 5 easier, and under certain conditions, the pellicle 5 will automatically strip without any manual operation in the warm water 22. However, if a surfactant is used, the glass photomask 1 must be rinsed with ethanol, isopropyl alcohol or the like, for example, after stripping the pellicle 5 in order to remove any residual adsorptive surfactants.

Fourth Embodiment

Figure 3:
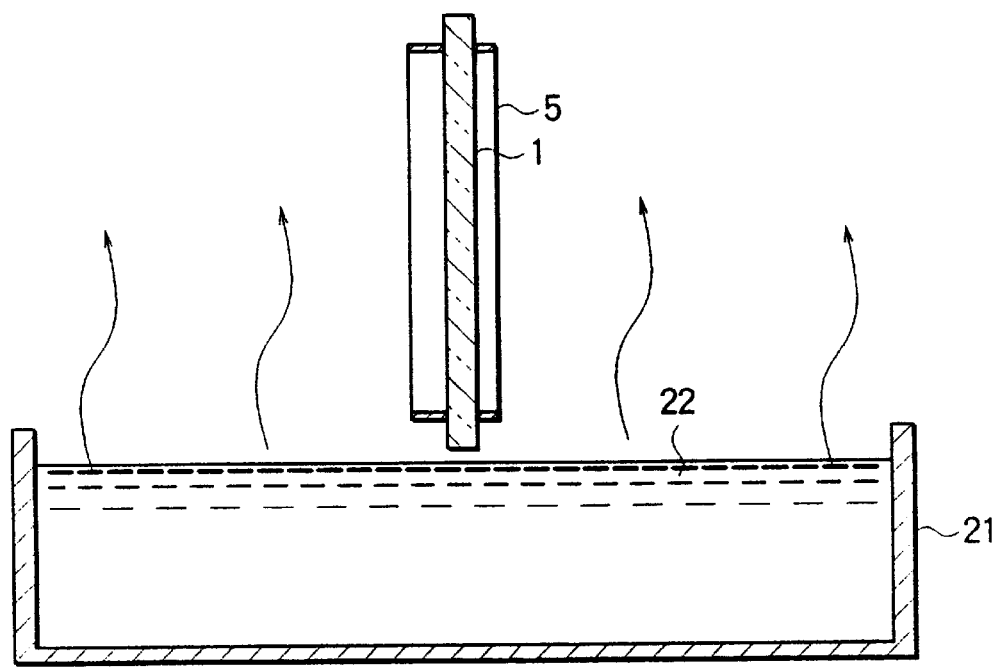
FIG. 3 is a cross-sectional view illustrating a pellicle stripping method of the fourth embodiment of the present invention.

FIG. 3 is a cross-sectional view showing a pellicle stripping method based on the fourth embodiment of the present invention. The pellicle stripping method of the fourth embodiment includes boiling the warm water 22 in the container 21 and exposing the pellicle 5 and the glass photomask 1 to the steam. According to the process, as the adhesiveness of the adhesive of the pellicle 5 decreases, the pellicle 5 is easily stripped without harmful effects to humans or contamination of the glass photomask 1.

In the case of immersing the pellicle 5 into the warm water 22, the foreign objects adhered to the pellicle 5 and other places may contaminate the glass photomask 1 after dissolving in the warm water 22. However, this steam method enables the stripping of the pellicle 5 in a clean condition without any foreign objects adhered to the pellicle 5 being removed.

A suitable temperature for the steam is 50° C. or higher like the water temperature for the above first embodiment, and a temperature lower than that would negatively affect the pellicle 5 and the photomask 1. Also, boiling water is preferable for forming a sufficient amount of steam.

Fifth Embodiment

Figure 4:
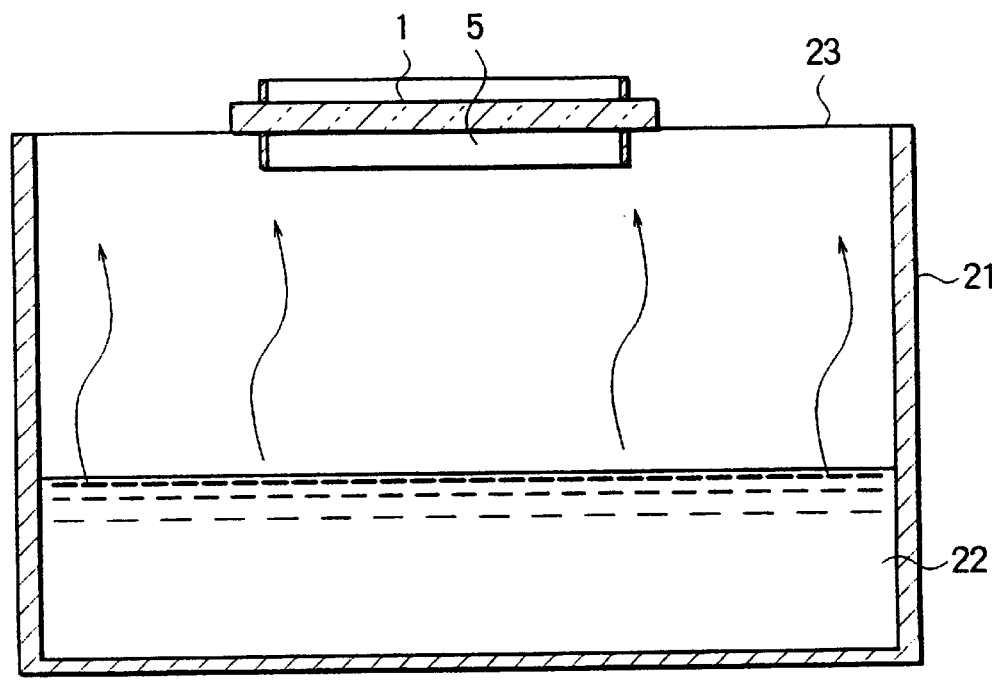
FIG. 4 is a cross-sectional view illustrating a pellicle stripping apparatus of a fifth embodiment of the present invention.

FIG. 4 is a cross-sectional view illustrating a pellicle stripping apparatus of the fifth embodiment of the present invention. In FIG. 4, the warm water 22 in the container 21 is boiled by heating with a heater (not shown in the figure). A cover 23 is provided on the container 21. The cover 23 has an opening larger than the pellicle 5 but smaller than the glass photomask 1, and the pellicle 5 is inserted into the opening.

In this apparatus, the upper opening of the container 21 is closed tightly by the cover 23 and glass photomask 1 except for a vent for the steam to maintain the heat of the steam so that the adhesiveness of the adhesive of the pellicle 5 can be efficiently decreased.

Sixth Embodiment

Figure 5:
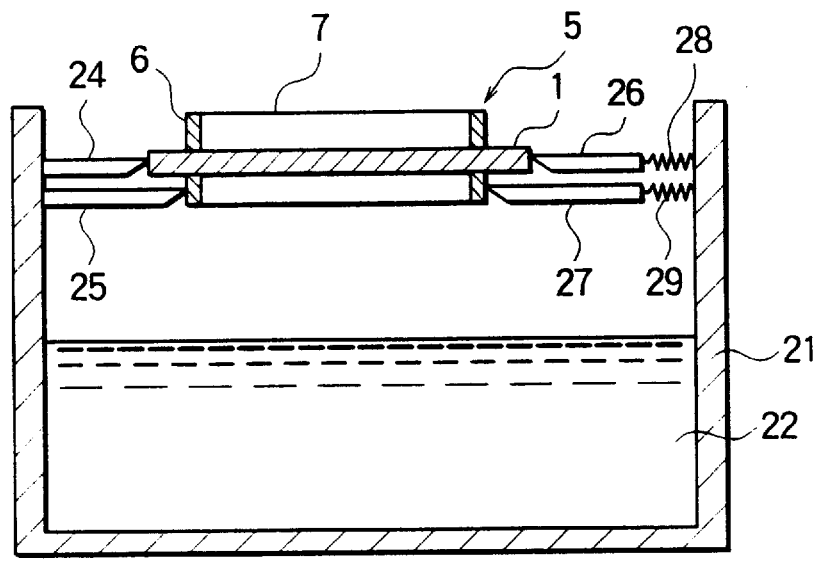
FIG. 5 is a cross-sectional view illustrating a pellicle stripping apparatus of a sixth embodiment of the present invention.

FIG. 5 is a cross-sectional view illustrating a pellicle stripping apparatus of the sixth embodiment of the present invention. In FIG. 5, the warm water 22 in the container 21 is boiled by a heater or the like. Fixed claws 24 and 25 contacting with the edges of the glass photomask 1 and the pellicle frame 6 are attached on one inside wall of the container 21. Furthermore, movable claws 26 and 27 contact other edges of the glass photomask 1 and the pellicle frame 6 are attached on the opposite inside wall of the container 21 through springs 28 and 29.

In this apparatus, because the fixed claws 24 and 25 and the movable claws 26 and 27 contact with the side faces of the glass photomask 1 and the pellicle frame 6, the adhesive section of the pellicle 5 adhered to the glass photomask can be sufficiently exposed to the steam without damaging the glass photomask 1.

Seventh Embodiment

Figure 6:
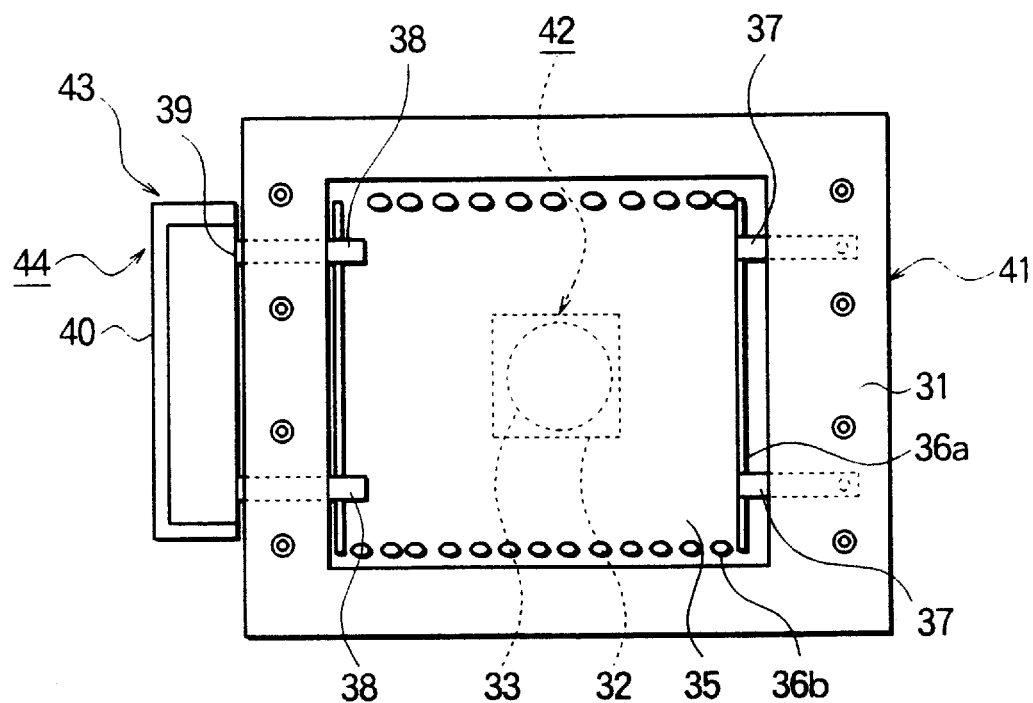
FIG. 6 is a plan view illustrating a pellicle stripping apparatus of a seventh embodiment of the present invention.
Figure 7:
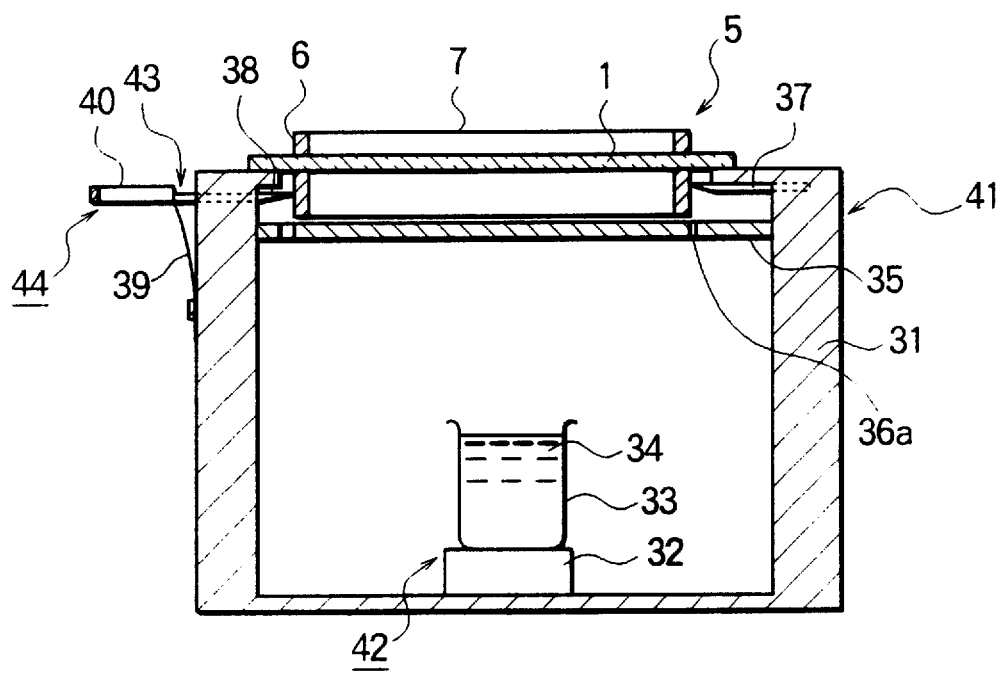
FIG. 7 is a cross-sectional view illustrating the state of the apparatus in FIG. 6 while in use.
Figure 8:
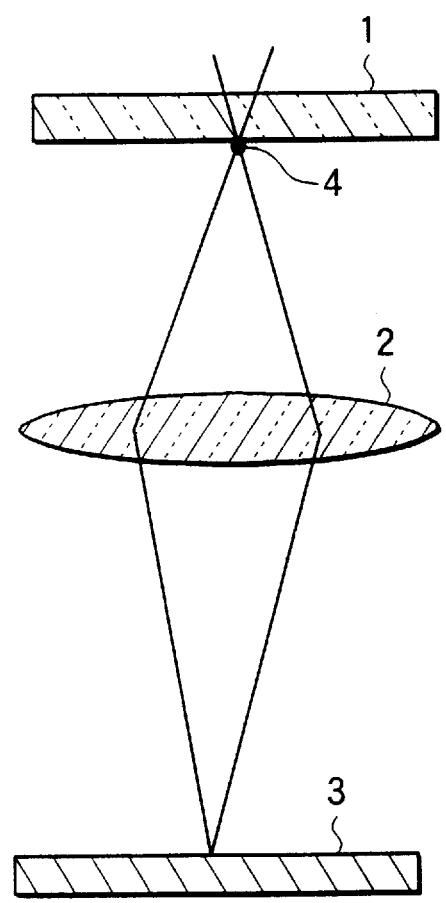
FIG. 8 is a schematic representation illustrating a conventional photoengraving process of a semiconductor device.
Figure 9:
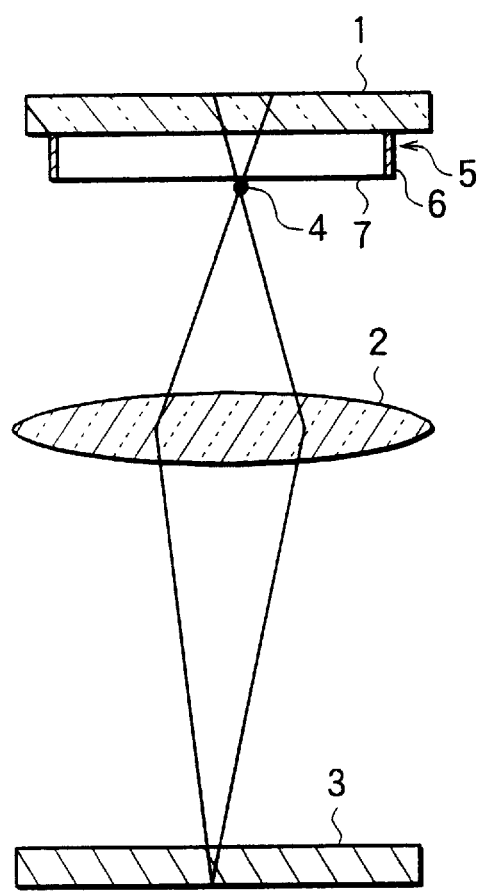
FIG. 9 is a schematic representation illustrating a pellicle attached to the glass photomask of FIG. 8.
Figure 10:
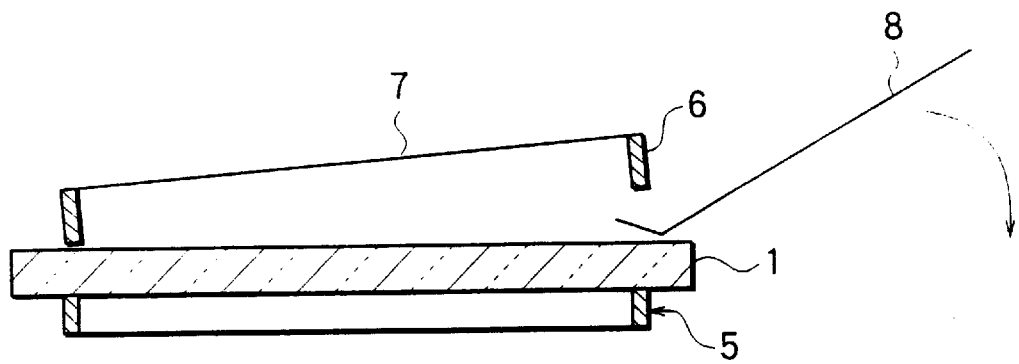
FIG. 10 is a cross-sectional view illustrating an example of the conventional pellicle stripping method.
Figure 11:
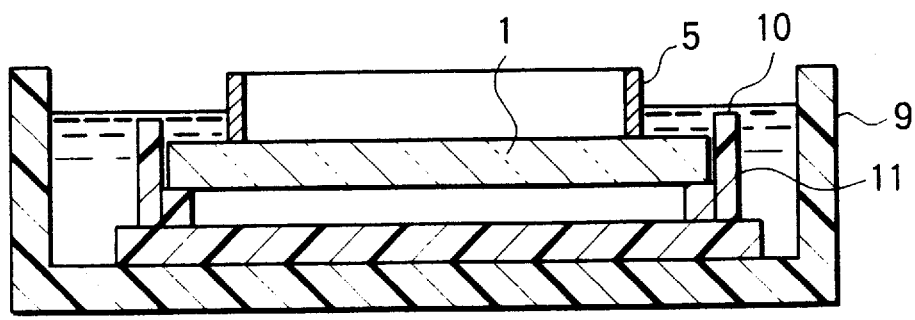
FIG. 11 is a cross-sectional view illustrating another example of the conventional pellicle stripping method.

FIG. 6 is a cross-sectional view illustrating a pellicle stripping apparatus of the seventh embodiment of the present invention, and FIG. 7 is a cross-sectional view illustrating the state of the apparatus in FIG. 6 during use. In these figures, a heater 32 is provided in the container body 31 made of stainless steel, for example, and a beaker 33 is placed on the heater 32. The steam is formed in the container body 31 by heating the warm water 34 in the beaker 33 with the heater 32.

A cover 35 is provided at the opening of the container body 31. The cover 35 has slit shaped vents 36a and a number of circular vents 36b. These vents 36a and 36b are provided in order to vent the steam in the container body 31 upwards, and their shapes and configuration are not limited to those shown in FIG. 6.

A pair of fixed claws 37 are placed on one inside wall of the container body 31 at a certain interval. A pair of movable claws 38 which can move freely horizontally are placed on the opposite inside wall of the container body 31. The movable claws 38 are kept inside of the container body 31 through leaf springs 39 attached on the outside of the container body 31. The fixed claws 37 and movable claws 38, which are opposite each other, grip the pellicle frame 6 at both side faces by means of the spring force of the leaf springs 39. The movable claws 38 have levers 40 to move the movable claws 38 to the left against the leaf springs 39.

A container 41 comprises the container body 31 and the cover 35, and a steam generating section 42 comprises the container 41, the heater 32 and the beaker 33. A gripping portion 43 comprises the fixed claws 37, the movable claws 38, the leaf springs 39 and the lever 40, and a supporting section 44 comprises the gripping portion 43 and the container body 31.

In the above-mentioned pellicle stripping apparatus, the glass photomask 1 with the pellicle adhered thereto is placed on the container body 31 when the movable claws 38 are drawn back with the lever 40. Next, the side faces of the pellicle frame 6 are gripped between the movable claws 38 and the fixed claws 37 by returning the lever 40 as shown in FIG. 7.

In the meantime, steam is formed in the container body 31 by heating the warm water 34 with the heater 32. The steam blows out from the vents 36a and 36b, and reaches the section of the pellicle 5 adhered with the glass photomask 1. Therefore, the adhesiveness of the adhesive is decreased so the pellicle 5 can be easily stripped by pulling it apart from the glass photomask 1. In this process, because the pellicle 5 is gripped at both side faces of the pellicle frame 6, damage to the glass photomask 1 can be prevented.

In a pellicle stripping test using an acrylic adhesive having an adhesion strength of 1,207 g/inch, the pellicle can be easily stripped after a one minute exposure to the steam. Similarly, in an acrylic adhesive having an adhesion strength of 1,810 g/inch, the pellicle can be easily stripped after three minutes exposure.

The photomask is not be limited to a glass photomask, but reticle and master masks may also be used. Furthermore, this invention is applicable to a liquid crystal photomask with a pellicle.

What is claimed is:

1. A pellicle stripping apparatus comprising:

a supporting section for supporting a photomask, said supporting section having gripping portions for gripping at least two edges of a pellicle frame of a pellicle adhered to the photomask; and a steam generating section for generating high temperature steam and contacting the pellicle adhered to the photomask with the steam, said steam generating section including a container having a steam vent directly opposite a portion of the pellicle adhered to the photomask and a heater for boiling water in said container.

2. The pellicle stripping apparatus in accordance with claim 1, wherein said gripping portions include a fixed claw fixed to said supporting section, a movable claw attached to said supporting section opposite said fixed claw and moving reciprocally, and a structure forcing said movable claw in a direction to grip the pellicle frame between said fixed claw and said movable claw.

3. The pellicle stripping apparatus in accordance with claim 2, wherein said structure forcing said movable claw comprises a spring.

4. The pellicle stripping apparatus in accordance with claim 3, wherein said spring is a leaf spring.

5. The pellicle stripping apparatus in accordance with claim 1, wherein said container includes a container body housing said heater, and a cover disposable on said container body and having said steam vent.

\* \* \* \* \*